United States Patent
Schaffer et al.

(10) Patent No.: US 6,556,077 B2
(45) Date of Patent: Apr. 29, 2003

(54) INSTRUMENTATION AMPLIFIER WITH IMPROVED AC COMMON MODE REJECTION PERFORMANCE

(75) Inventors: Viola Schaffer, Tucson, AZ (US); Michael V. Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/813,619

(22) Filed: Mar. 20, 2001

(65) Prior Publication Data

US 2002/0163383 A1 Nov. 7, 2002

(51) Int. Cl.[7] .............................................. H03F 3/45
(52) U.S. Cl. ................................... 330/69; 330/150
(58) Field of Search ............................ 330/69, 107, 109, 330/124 R, 150

(56) References Cited

U.S. PATENT DOCUMENTS

| | | | |
|---|---|---|---|
| 4,206,416 A | | 6/1980 | Kellogg ........................ 330/69 |
| 5,258,723 A | | 11/1993 | Mazzucco et al. ........... 330/258 |
| 5,568,561 A | * | 10/1996 | Whitlock ..................... 330/258 |
| 5,625,317 A | * | 4/1997 | Deveirman .................. 330/109 |
| 5,792,956 A | * | 8/1998 | Li ............................... 330/260 |
| 5,880,634 A | * | 3/1999 | Babanezhad ................ 330/107 |
| 6,222,418 B1 | * | 4/2001 | Gopinathan et al. ........ 330/292 |
| 6,232,816 B1 | * | 5/2001 | Ueda ........................... 327/307 |
| 6,252,459 B1 | * | 6/2001 | Franck ........................ 330/109 |
| 6,310,518 B1 | * | 10/2001 | Swanson ..................... 330/282 |

FOREIGN PATENT DOCUMENTS

| | | | | |
|---|---|---|---|---|
| WO | WO 93/24993 | * | 12/1993 | ............. H03F/3/45 |

* cited by examiner

Primary Examiner—Robert Pascal
Assistant Examiner—Khanh V. Nguyen
(74) Attorney, Agent, or Firm—W. Daniel Swayze, Jr.; W. James Brady; Frederick J. Telecky, Jr.

(57) ABSTRACT

A method and apparatus for improving the AC common mode rejection performance of monolithic two op-amp instrumentation amplifiers is disclosed. A new approach to designing the first op-amp of an instrumentation amplifier is provided wherein the frequency of the first op-amp is manipulated such that the dominant pole is pushed out to higher frequencies than is possible using traditional methods while maintaining good open loop gain and closed loop stability. One way to achieve this is by designing the first op-amp such that it has two dominant, low frequency poles and a higher frequency zero to provide stability. With this design of a first op-amp, the range of high common mode rejection ratio is extended to frequencies an order of magnitude higher than achievable by conventional means without additional requirements for bandwidth, power or die area. Utilizing this principle makes it possible to design small, low power, two op-amp instrumentation amplifiers that can reject line noise and its harmonics, tasks that previously required three op-amp architectures or hundreds of megahertz bandwidth.

10 Claims, 5 Drawing Sheets ical amplifier which extends the high CMRR range to frequencies previously only achievable with the large bandwidth and higher quiescent current required by prior art instrumentation amplifiers.

INSTRUMENTATION AMPLIFIER WITH IMPROVED AC COMMON MODE REJECTION PERFORMANCE

BACKGROUND OF THE INVENTION

1. Field of the Invention

The present invention relates generally to an instrumentation amplifier. More particularly, the present invention relates to a design for a monolithic two op-amp instrumentation amplifier which extends the range of high common mode rejection to frequencies an order of magnitude higher than achievable by conventional means.

2. State of the Art

The primary function of an instrumentation amplifier is to provide gain and to immunize signals from undesirable disturbances. To do this, a good instrumentation amplifier must provide a high common mode rejection ratio (CMRR), high power supply rejection ratio (PSRR), high input impedance and high gain accuracy. While the DC CMRR is often used as a figure of merit for an instrumentation amplifier, many applications (i.e., bridge sensors) also require rejection of higher frequency common mode components (e.g., line frequency and harmonics).

Traditionally, three op-amp instrumentation amplifiers have been used for applications where AC CMRR performance is critical. Two op-amp topology, which is also widely used, provides a significant decrease in price and die area, but conventionally provides inferior CMRR performance over frequency range.

U.S. Pat. No. 5,258,723 discloses one technique of achieving a single supply instrumentation amplifier having high AC CMRR specifically adapted for use with a zirconium-dioxide oxygen sensor for automotive applications.

FIG. 1 shows a graph of the CMRR versus frequency for several prior art instrumentation amplifiers. To effectively reject line noise (at 60 Hz) and its harmonics, it is desirable that the CMRR stay above 90 dB to at least 180 Hz. Grid line 16 represents 200 Hz. For each of the prior art instrumentation amplifiers shown, the CMRR drops below 90 dB before 100 Hz and, thus, does not effectively reject the line noise harmonics. Therefore, it would be desirable to provide a low power, low cost, general purpose instrumentation amplifier which maintains its high CMRR at higher frequencies, yet does not use excessive die area.

SUMMARY OF THE INVENTION

It is an object of the invention to provide a technique for a low cost, low power two op-amp instrumentation amplifier, which extends the range of high common mode rejection ratio to frequencies an order of magnitude higher than achievable by conventional means.

It is another object of the invention to provide a new approach for designing the first op-amp of an instrumentation amplifier, wherein the frequency response of an amplifier is manipulated such that the dominant pole is pushed out to higher frequencies than is possible using traditional methods, while maintaining open loop gain and closed loop stability.

It is yet another object of the invention to provide a design for a first op-amp of an instrumentation amplifier which includes a first path which dominates the frequency response of the first op-amp at low frequencies, and a second path which dominates the frequency response of the first op-amp at high frequencies.

The present invention provides a design for a low power instrumentation amplifier which extends the high CMRR range to frequencies previously only achievable with the large bandwidth and higher quiescent current required by prior art instrumentation amplifiers.

According to one embodiment of the invention, a first op-amp of a two op-amp instrumentation amplifier includes first and second gain stages coupled in series, and a third gain stage coupled in parallel to the series combination of the first and second gain stages. The output of the series combination is added to the output of the third gain stage at a summing junction. By including two gain stages in series, the frequency response of the first op-amp is characterized by two poles to allow the open loop gain of the instrumentation amplifier to drop off rapidly after the desired frequency, thereby minimizing the required unity gain bandwidth. By including a third gain stage as a feedforward path, the frequency response of the first op-amp is further characterized by a zero to maintain the stability of the frequency response by canceling the effects of one of the poles at high frequencies. This configuration of gain stages provides the desired result of achieving a low cost, low power, two op-amp instrumentation amplifier with high CMRR.

BRIEF DESCRIPTION OF THE SEVERAL VIEWS OF THE DRAWINGS

The nature of the present invention as well as other embodiments of the present invention may be more clearly understood by reference to the following detailed description of the invention, to the appended claims, and to the drawings herein, wherein:

DETAILED DESCRIPTION OF THE INVENTION

Figure 1:
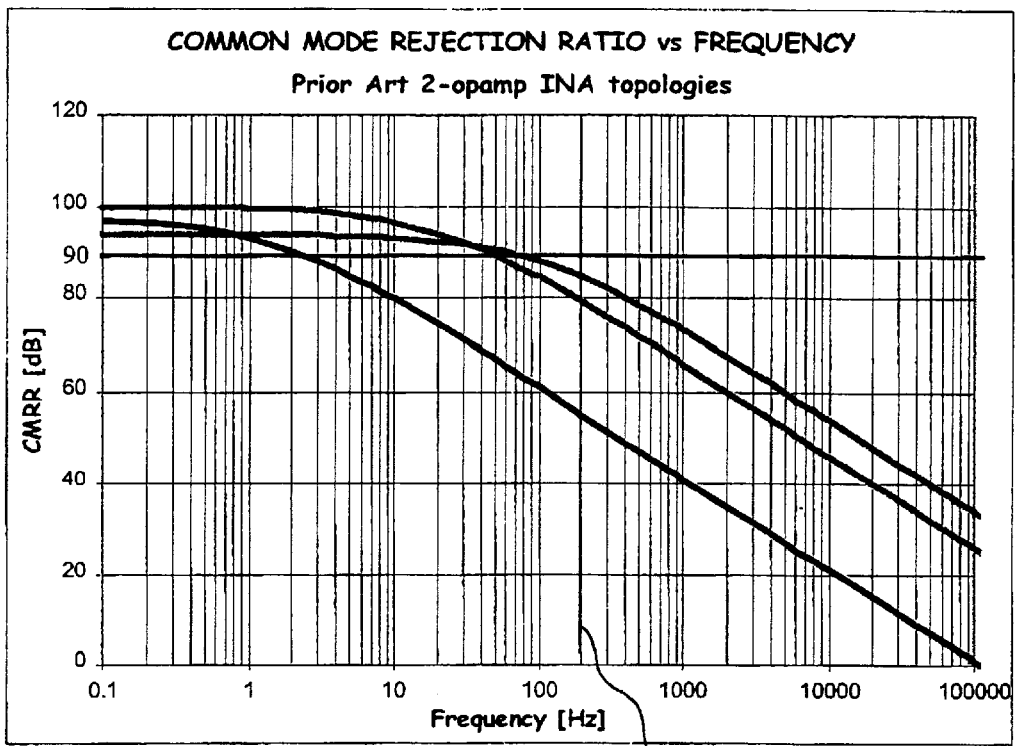
FIG. 1 is a graph of the CMRR versus frequency for several exemplary prior art instrumentation amplifiers each using two op-amp topologies.

This application describes a technique to extend the common mode rejection bandwidth of two op-amp instrumentation amplifiers. In reference to FIG. 2A, an instrumentation amplifier 2 connected in a two op-amp topology has the negative input (IN−) applied through terminal 8 to the noninverting input of the first op-amp 4 and the positive input (IN+) applied through terminal 10 to the noninverting input of the second op-amp 6. A first resistor R1 is coupled between a reference terminal 12 and the inverting input of the first op-amp 4, a second resistor R2 is coupled between the inverting input of the first op-amp 4 and the output of the first op-amp 4, a third resistor, R3 is coupled between the output of the first op-amp 4 and the inverting input of the second op-amp 6 and a fourth resistor R4 is coupled between the inverting input of the second op-amp 6 and the output of the second op-amp 6. The output of the second op-amp 6 is coupled to the output terminal 14 of the instrumentation amplifier 2. The DC transfer function for the potential at the output terminal 14 of such system may be written as:

$$V_{14} = \left[1 + \frac{R_4}{R_3}\right]V_{10} - \left[\frac{R_2}{R_1}\frac{R_4}{R_3} + \frac{R_4}{R_3}\right]V_8 + \left[\frac{R_2}{R_1}\frac{R_4}{R_3}\right]V_{12}$$

R1 may be set equal to R4, and R2 may be set equal to R3 to assure that the DC gain from terminal 8 has the same magnitude and opposite sign as the gain from terminal 10 and that the common mode gain is 0. This also assures that the gain from reference terminal 12 is unity.

However, the non-ideal nature of the amplifier structures, such as finite open loop gain bandwidth, as well as random mismatches in resistor ratios and the asymmetrical configuration of the instrumentation amplifier, result in imperfect cancellation of common mode signals. The resistor mismatches and the finite open loop gain affect the DC and low frequency common mode rejection while the finite bandwidth of the internal amplifiers, together with the asymmetrical instrumentation amplifier configuration, cause a rapid decrease of common mode rejection as the frequency of the common mode signal increases.

Figure 2A:
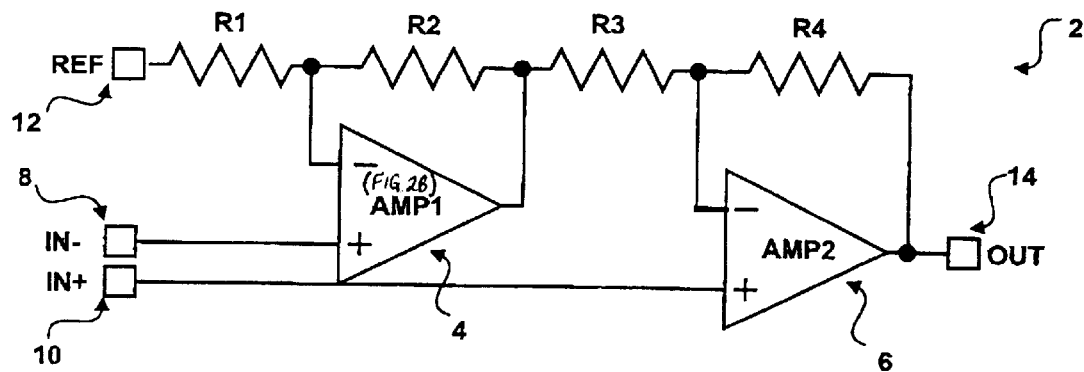
FIG. 2A is a general circuit diagram of an instrumentation amplifier according to an embodiment of the present invention.

For the two op-amp instrumentation amplifier topology 2 shown in FIG. 2A, assuming single pole responses for both amplifiers and having parameters corresponding to amplifiers 4 and 6, respectively comprising poles $P_{4\ and\ P6}$ and open loop DC gains $A_{O4}$ and $A_{O6}$ with feedback factors $\beta_4$ and $\beta_6$ the common mode gain $A_{CM}$ may be expressed as:

$$A_{CM} = \left(\Delta_R + \frac{\beta_1\beta_2}{A_{O1}}\right)\frac{\left(1 + \frac{s}{P_1}\right)}{\left(1 + \frac{s}{P_1 A_{O1}\beta_1}\right)\left(1 + \frac{s}{P_2 A_{O2}\beta_2}\right)}$$

Figure 3:
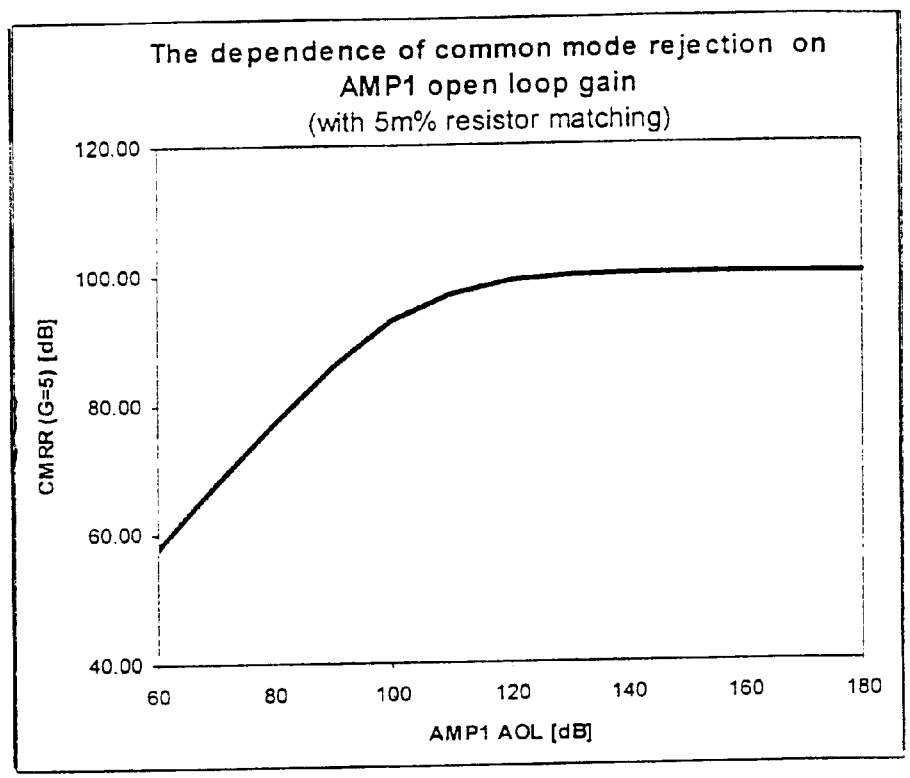
FIG. 3 is a graph of the CMRR versus open loop gain of the first op-amp in a two op-amp instrumentation amplifier.

As stated above, the DC common mode rejection performance is determined by the resistor mismatch ($\Delta_R$) between resistor ratios R1/R2 and R4/R3. The low frequency zero located at the frequency $P_4$ in the common mode gain $A_{CM}$ causes the CMRR to roll off at low frequencies. For example as illustrated in FIG. 3, a $\Delta_R$=5m % resistor mismatch will limit the CMRR to 100 dB in a gain of 5 configuration until the open loop gain of amplifier 4 drops below 120 dB. At this point, the finite open loop gain will dominate, decreasing the CMRR.

Figure 4A:
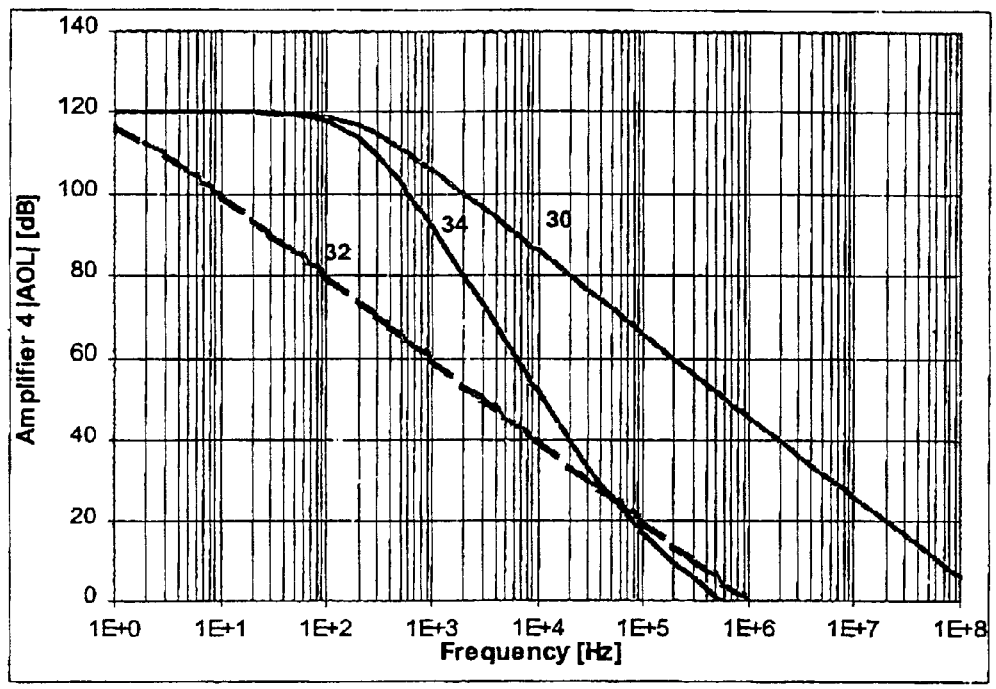
FIG. 4A is a graph of the open loop gain versus frequency of the first op-amp in an operational amplifier comparing the response of prior art topologies with that of an embodiment of the present invention.

It can be concluded that the AC CMRR can be improved by pushing out the dominant pole of the first op-amp 4 ($P_4$) to a higher frequency ensuring that the open loop gain of the first op-amp 4 does not drop below 120 dB until past the desired rejection band. However, as illustrated in FIG. 4a by line 30, for a traditional single pole op-amp and open loop gain of 120 dB at 200 Hz, at least 200 MHz bandwidth is required. This is unrealistic for low power amplifiers which typically have open loop gain behaviors as illustrated by line 32.

The present application describes a technique for extending the common mode rejection bandwidth by using feedforward compensation to manipulate the frequency response of amplifier 4 such that the dominant pole is pushed out to higher frequencies than it is possible with traditional methods without the need for high bandwidth while maintaining high DC open loop gain and closed loop stability.

Figure 2B:
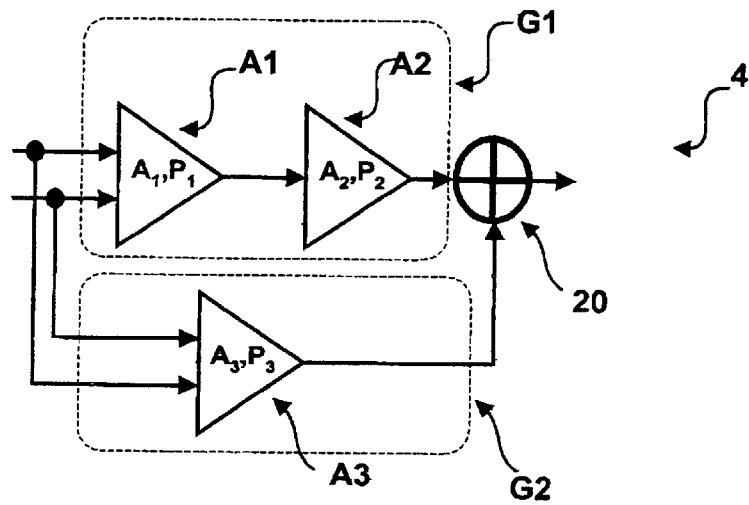
FIG. 2B is a block circuit diagram of one embodiment of the first op-amp of the instrumentation amplifier of FIG. 2A.

FIG. 2B shows the block diagram of an embodiment of the first amplifier 4 of the instrumentation amplifier 2 shown in FIG. 2A that accomplishes this goal. The amplifier 4 comprises two parallel gain paths G1 and G2, which are added together at the summing junction 20. The path G1 comprises two gain stages A1 and A2 coupled in series with respective DC gains $A_1$ and $A_2$ and poles $P_1$ and $P_2$. Path G2 has a single gain stage A3 with DC gain $A_3$ and pole $P_3$.

Figure 7:
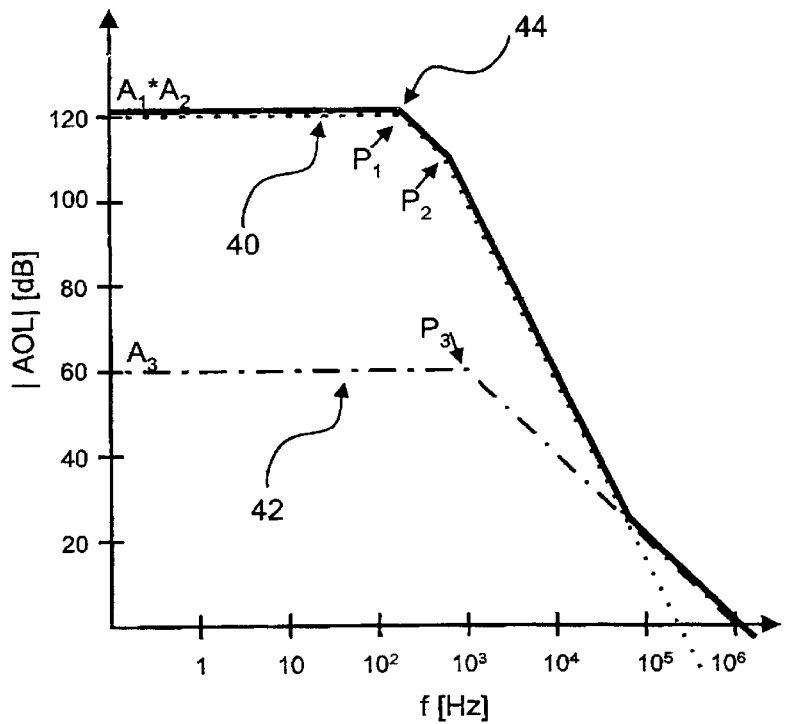
FIG. 7 is a graph comparing the frequency responses of the two gain paths of the circuit of FIG. 5 with the overall frequency response of the operational amplifier.

The operation of the arrangement is best described in reference to FIG. 7. Lines 40 and 42 denote the frequency behaviors of G1 and G2 respectively and line 44 represents the sum of lines 40 and 42, describing the frequency behavior of the system. At low frequencies, the G1 path dominates the frequency of the system since it has significantly higher gain. Poles P1 and P2 each contribute −20 dB/decade gain decrease to the frequency behavior of the G1 path. At lower frequencies, the gain of the path G2 overtakes as it exceeds the gain of G1, providing adequate phase margin and, thus, system stability for low gain configurations.

Figure 4B:
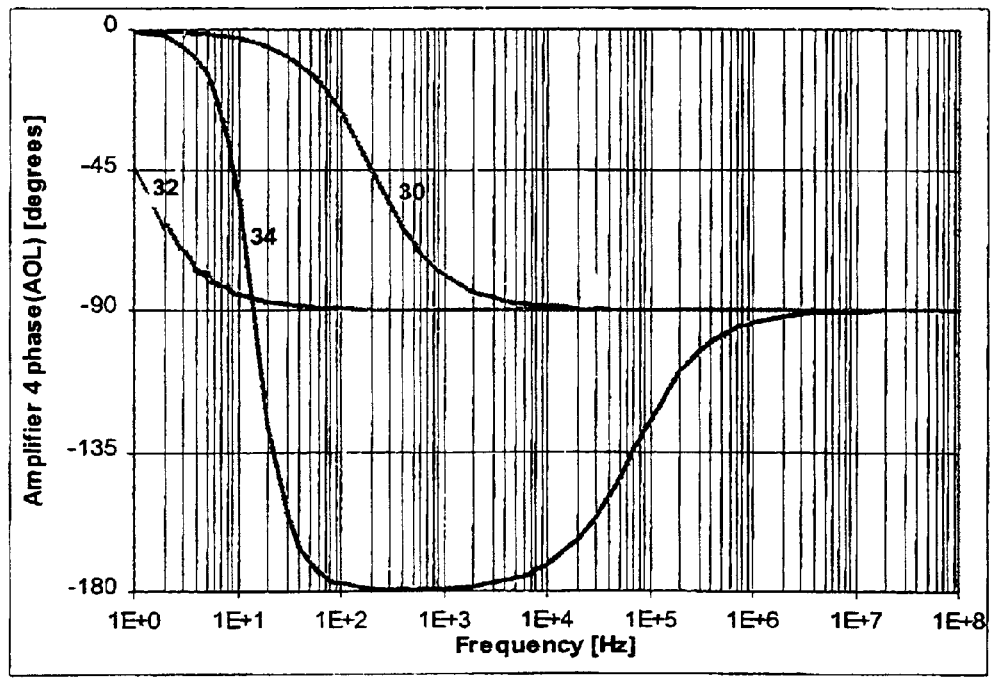
FIG. 4B is a graph of the phase margin versus frequency for the first op-amp in an operational amplifier corresponding to the graph of FIG. 4*a*.

FIGS. 4A and 4B contrast the gain magnitude and phase margin of prior art topologies, represented by lines 30 and 34, with a system designed according to an embodiment of the invention represented by line 32. Line 32 has the same location for its dominant pole as the 200 MHz system represented by line 34 while it requires only the same unity gain bandwidth (around 1 MHz) as a conventional low power system represented by line 30. All three systems have close to 90 degrees of phase margin at the crossover frequency and are, therefore, stable. In this way, the goal of pushing out the dominant pole to higher frequencies, without the conventional requirement of a wide bandwidth, is accomplished without comprising stability.

Figure 6:
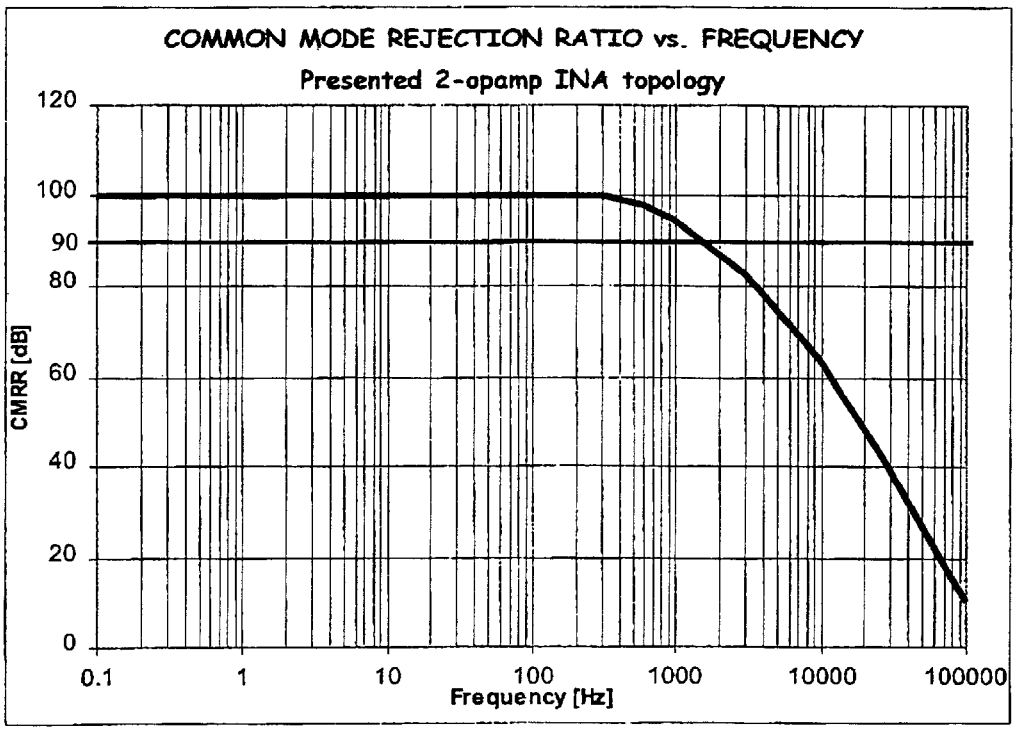
FIG. 6 is a graph of common mode rejection versus frequency for a two op-amp implementation amplifier configured according to an embodiment of the present invention.
Figure 5:
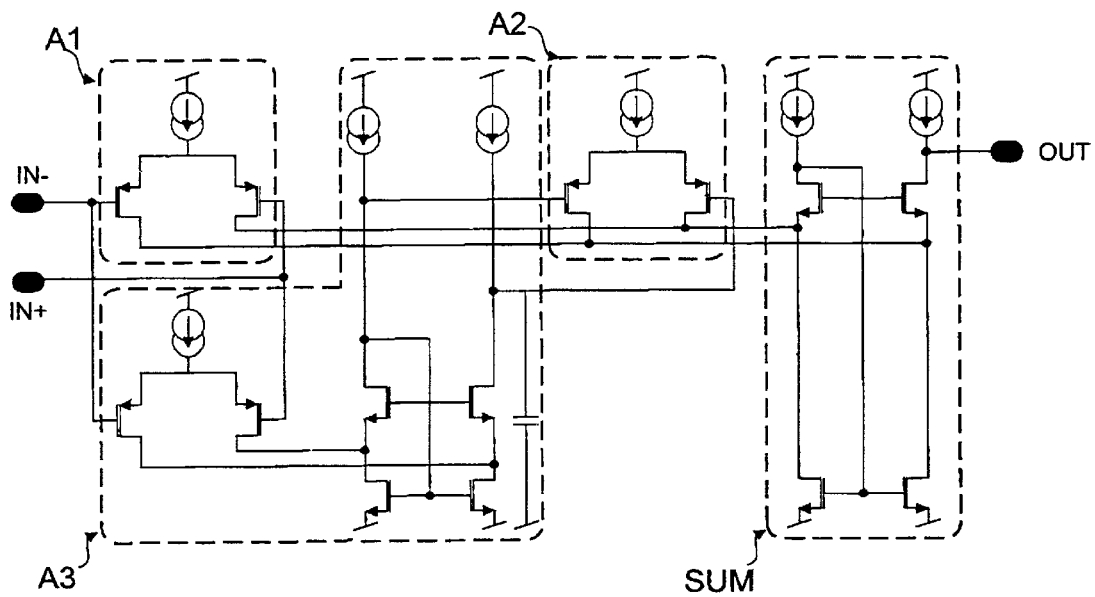
FIG. 5 is a schematic diagram of a specific implementation of the first op-amp of an instrumentation amplifier according to an embodiment of the present invention.

A schematic implementation of the block diagram illustrated in FIG. 2B is shown in FIG. 5. FIG. 6 shows the measurement results of the CMRR versus frequency for the implementation of the instrumentation amplifier 2 with a first amplifier 4 as shown in FIG. 5. The CMRR of the instrumentation amplifier does not drop below 90 dB until 1.3 KHz, well over a decade (in some cases two decades) higher than the prior art instrumentation amplifiers demonstrated in FIG. 1.

Although the present invention has been shown and described with reference to particular preferred embodiments, various additions, deletions and modifications that are obvious to a person skilled in the art to which the invention pertains, even if not shown or specifically described herein, are deemed to lie within the scope of the invention as encompassed by the following claims.

For example, the first op-amp of a two op-amp instrumentation amplifier may comprise more than two parallel gain paths to yield similar or even improved results. To maintain stability, the number of poles should not exceed the number of zeros by more than one. However, by characterizing the frequency response of the first op-amp with a plurality of poles and a plurality of zeros, a more specific frequency response may be achieved. In practice, the circuitry for the poles may be placed as gain stages in series with the first and second gain stages described in the previous embodiments, and the zeros may be placed as gain stages in parallel with the primary signal path. In this way, a two op-amp instrumentation amplifier may be designed with more of the advantages of three op-amp architectures without excessive bandwidth.

What is claimed is:

1. A two op-amp instrumentation amplifier having a first op-amp and a second op-amp coupled in series between an input and an output of the instrumentation amplifier, the two op-amp instrumentation amplifier comprising a first op-amp with a frequency response characterized by at least two low frequency poles and at least one zero.

2. The two op-amp instrumentation amplifier of claim 1, wherein the at least one zero is at a frequency greater than a frequency associated with each of the at least two low frequency poles.

3. The two op-amp instrumentation amplifier of claim 1, wherein a summing junction is coupled to the output of the first op-amp through an output stage of the summing junction.

4. A two op-amp instrumentation amplifier having a first op-amp and a second op-amp coupled in series between an input and- an output of the instrumentation amplifier, the two op-amp instrumentation amplifier comprising a first op-amp with a frequency response characterized by at least two low frequency poles and at least one zero, the first op amp circuitry comprising:
  a first gain stage having a first input coupled to an inverting input of the first op-amp, a second input coupled to a noninverting input of the first op-amp, and a first stage output;
  a second gain stage having an input coupled to the first stage output, and a second stage output;
  a third gain stage having a first input coupled to the inverting input of the first op-amp, a second input coupled to the noninverting input of the first op-amp, and an output; and
  a summing junction coupled to the outputs of the second and third gain stages for summing the outputs of signals received therethrough, and coupled to an output of the first op-amp.

5. A two op-amp instrumentation amplifier having a first op-amp and a second op-amp coupled in series between an input and an output of the instrumentation amplifier, the two op-amp instrumentation amplifier comprising a first op-amp with a frequency response characterized by at least two low frequency poles and at least one zero,
  wherein the two op-amp instrumentation amplifier having a reference voltage input and an amplifier output, a second op-amp with both inverting and non-inverting inputs and an output, the first and second op-amps being coupled in series between the amplifier inputs and the amplifier output, the first op-amp of the two op-amp instrumentation amplifier further comprising:
    a first resistor coupled between the reference voltage input and the inverting input of the first op-amp;
    a second resistor coupled between the inverting input of the first op-amp and the output of the first op-amp;
    a third resistor coupled between the output of the first op-amp and an inverting input of the second op-amp;
    a fourth resistor coupled between the inverting input of the second op-amp and the output of the second op-amp;
    a negative input coupled to the noninverting input of the first op-amp; and
    a positive input coupled to the noninverting input of the second op-amp.

6. The instrumentation amplifier of claim 5, wherein the first resistor is selected to have a value substantially equal to the fourth resistor and the second resistor is selected to have a value substantially equal to the third resistor.

7. A two op-amp instrumentation amplifier having an inverting amplifier input a noninverting amplifier input, a reference voltage input and an amplifier output, a first op-amp with both inverting and non-inverting inputs and an output, and a second op-amp with both inverting and non-inverting inputs and an output, the first and second op-amps being coupled in series between the amplifier inputs and the amplifier output, the two op-amp instrumentation amplifier comprising the first op-amp configured to comprise:
  a first gain stage having a first input coupled to the inverting input of the first op-amp, a second input coupled to the noninverting input of the first op-amp, and a first stage output;
  a second gain stage having an input coupled to the first stage output, and a second stage output;
  a third gain stage having a first input coupled to the inverting input of the first op-amp, a second input coupled to the noninverting input of the first op-amp, and an output; and
  a summing junction coupled to the outputs of the second and third gain stages for summing the outputs of signals received therethrough, and coupled to the output of the first operational amplifier.

8. The two op-amp instrumentation amplifier of claim 7, wherein the summing junction is coupled to the output of the first op-amp through an output stage.

9. A two op-amp instrumentation amplifier having an inverting amplifier input a noninverting amplifier input, a reference voltage input and an amplifier output, a first op-amp with both inverting and non-inverting inputs and an output, and a second op-amp with both inverting and non-inverting inputs and an output, the first and second op-amps being coupled in series between the amplifier inputs and the amplifier output, the two op-amp instrumentation amplifier comprising the first op-amp configured to comprise:
  a first gain stage having a first input coupled to the inverting input of the first op-amp, a second input coupled to the noninverting input of the first op-amp, and a first stage output;
  a second gain stage having an input coupled to the first stage output, and a second stage output;
  a third gain stage having a first input coupled to the inverting input of the first op-amp, a second input coupled to the noninverting input of the first op-amp, and an output; and
  a summing junction coupled to the outputs of the second and third gain stages for summing the outputs of signals received therethrough, and coupled to the output of the first operational amplifier, further comprising:
    a first resistor coupled between the reference voltage input and the inverting input of the first op-amp;
    a second resistor coupled between the inverting input of the first op-amp and the output of the first op-amp;
    a third resistor coupled between the output of the first op-amp and an inverting input of the second op-amp;
    a fourth resistor coupled between the inverting input of the second op-amp and the output of the second op-amp;
    a negative coupled to the noninverting input of the first op-amp; and
    a positive coupled to the noninverting input of the second op-amp.

10. The two op-amp instrumentation amplifier of claim 9, wherein the first resistor is selected to have a value substantially equal to the fourth resistor and the second resistor is selected to have a value substantially equal to the third resistor.

* * * * *